United States Patent
Karino et al.

(10) Patent No.: US 9,166,064 B2
(45) Date of Patent: Oct. 20, 2015

(54) JUNCTION FIELD EFFECT TRANSISTOR

(71) Applicant: Fuji Electric Co., Ltd., Kanagawa (JP)

(72) Inventors: Taichi Karino, Nagano (JP); Hitoshi Sumida, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 14/560,516

(22) Filed: Dec. 4, 2014

(65) Prior Publication Data
US 2015/0200309 A1    Jul. 16, 2015

(30) Foreign Application Priority Data
Jan. 16, 2014  (JP) .................................. 2014-005648

(51) Int. Cl.
*H01L 29/808* (2006.01)
(52) U.S. Cl.
CPC .................... *H01L 29/808* (2013.01)

(58) Field of Classification Search
CPC ..................... H01L 29/7393; H01L 29/7825
USPC .......................................... 257/339, 330, 335
See application file for complete search history.

(56) References Cited

U.S. PATENT DOCUMENTS

2008/0117653 A1    5/2008  Saito
2015/0008481 A1*   1/2015  Pathirana et al. ............. 257/140

FOREIGN PATENT DOCUMENTS

| JP | 2007-12659 A | 1/2007 |
| JP | 2008-130733 A | 6/2008 |
| JP | 2008-153636 A | 7/2008 |

* cited by examiner

*Primary Examiner* — Marc Armand
(74) *Attorney, Agent, or Firm* — Chen Yoshimura LLP

(57) ABSTRACT

In a high voltage JFET, a p-floating region is provided in the surface layer of an n-drift region, thereby increasing the resistance R of the n-drift region and minimizing the voltage divided at a pn junction. This makes it possible to improve ESD capacity without increasing device size and without making the cutoff current smaller.

14 Claims, 14 Drawing Sheets

JUNCTION FIELD EFFECT TRANSISTOR

BACKGROUND OF THE INVENTION

1. Technical Field

The present invention relates to a high voltage junction field effect transistor (high voltage JFET) used in a start-up circuit for starting a switching power supply or the like.

2. Background Art

FIG. 8 is a circuit diagram of a switching power supply device 500. The switching power supply device 500 includes a rectifier 51 constituted of a bridge circuit that rectifies 100V or 200V alternating current, a smoothing capacitor 52 that smoothes the rectified current outputted from the rectifier 51, a control circuit 53 that controls and protects the switching power supply device 500, and a transformer 54 that insulates input and output. The power supply device 500 also has a MOSFET 55 that controls ON and OFF switching of current flowing to a primary side 54a of the transformer 54, and a power supply capacitor 56 that acts as a direct current power supply for a control circuit 53. A secondary side 54b of the transformer 54 has a rectifier diode 57 and an output capacitor 58, and direct current voltage is outputted from output terminals 59.

The control circuit 53 includes a start-up circuit 60, a low voltage shutdown circuit 61, a regulator 62, and a BO comparator 63. The control circuit also includes a transmitter 64, a driver circuit 65, an output amp 66, a latch circuit 67, and a PWM comparator 68.

The start-up circuit 60 supplies current to the power supply capacitor 56 during rise time of the switching power supply device 500 to charge the power supply capacitor 56, and acts as a direct current power supply for the control circuit 53. The low voltage shutdown circuit 61 shuts down the start-up circuit 60 when the voltage of the power supply capacitor 56 falls below a prescribed voltage. The BO comparator 63 functions to detect and monitor input voltage levels inputted to a high voltage input terminal VH through a diode 71 to protect a high voltage JFET 80 (brownout function). The driver circuit 65 controls ON and OFF switching of the MOSFET 55 connected to the primary side 54a of the transformer 54 via the output amp 66. Switching this MOSFET 55 ON and OFF controls voltage on the secondary side 54b of the transformer 54 and outputs a prescribed direct current voltage from the output capacitor 58. Other components constituting this switching power supply device 500 are not directly related to the present invention, and an explanation thereof will be omitted.

FIG. 9 is a circuit diagram of the start-up circuit 60, which forms a part of the control circuit 53 in FIG. 8. The start-up circuit 60 includes the high voltage JFET 70 and a start-up auxiliary circuit 90 (start-up internal circuit), which are start-up elements, and a resistor circuit 92 constituted of input voltage detection resistors. The high voltage JFET 70 has a plurality of sources, and a first JFET unit 70a and a second JFET unit 70b. The start-up auxiliary circuit 90 includes a MOSFET 91, which receives current from the sources of the high voltage JFET 70, and other JFETs and MOSFETs. High voltage is inputted to the drain of the high voltage JFET 70 from the high voltage input terminal VH of the start-up circuit 60, and current is supplied to the power supply capacitor 56 through the high voltage JFET 70 and the start-up auxiliary circuit 90 from the VCC terminal. This power supply capacitor 56 is the power supply for the control circuit 53, and the switching power supply device 500 is started through this start-up circuit 60. Explanations for other circuits are omitted here. The voltage inputted from the high voltage input terminal VH is divided at the resistor circuit 92 for detecting this voltage and then inputted to the BO terminal (brownout terminal). The current inputted from the high voltage input terminal VH flows to the MOSFET 91 of the start-up auxiliary circuit 90 through the high voltage JFET 70 and charges the power supply capacitor 56 through the VCC terminal.

FIGS. 10A and 10B are views of a configuration of a conventional high voltage JFET 70, FIG. 10A is a plan view of main parts thereof, and FIG. 10B is a cross-sectional view of the main parts in FIG. 10A cut along the line A-O. This high voltage JFET 70, which is a start-up element, is constituted of a first JFET 502 part and a second JFET part 503, and includes a p-gate region 72 that is the gate on a p-substrate 71, an n-source region 73 surrounded on three sides by the p-gate region 72, an n-drift region 74 that connects to the n-source region 73, and an n-drain region 75 that connects to the n-drift region 74. The high voltage JFET 70 also includes a p+ gate region 76, which is a p-contact region disposed in the surface layer of the p-gate region 72, an n+ source region 77, which is an n-contact region disposed in the surface layer of the n-source region 73, and an n+ drain region 78, which is an n-contact region disposed in the surface layer of the n-drain region 75. The high voltage JFET 70 also includes a LOCOS oxide film 79 disposed on the n-source region 73, the n-drift region 74, the n-drain region 75, and interposed between the n+ source region 77 and the n+ drain region 78. The high voltage JFET 70 also includes a first interlayer insulating film 81 provided on the LOCOS oxide film 79 and covering this film. The first interlayer insulating film 81 also covers a polysilicon electrode 80 disposed on the LOCOS oxide film 79 and connected to the p+ gate region 76. The high voltage JFET 70 further includes, on the first interlayer insulating film 81, a metal gate electrode wiring line 82 connected to the p+ gate region 76, a metal source electrode 83 connected to the n+ source region 77, and a metal drain electrode 84 connected to the n+ drain region 78. The high voltage JFET 70 further includes a second interlayer insulating film 85 disposed on the first interlayer insulating film 81, a source electrode wiring line 86 disposed on the second interlayer insulating film 85 and connected to the source electrode 83, and a drain electrode wiring line 87 (drain pad electrode/VH terminal) connected to the drain electrode 84.

The drain electrode wiring line 87, the drain electrode 84, the n+ drain region 78, and the n-drain region 75 are arranged in the center of the high voltage JFET 70, and the center of each of these has the same circular shape (each is a concentric circle). The inner edge of the n-drift region 74 contacts the n-drain region 75, and the outer edge contacts the p-gate region 72 and the n-source region 73.

The p-gate region 72 has a circular-shaped periphery, and the inner edge of the p-gate region 72 has recesses and protrusions. The n-source region 3 is disposed so as to enter these recesses, and the end thereof facing the center contacts the n-drift region 74.

Next, the operation of the high voltage JFET 70 will be explained. If a rectified voltage of AC100 is applied to the second drain electrode wiring line 87 (drain pad electrode) of the high voltage JFET 70, for example, then the current flows from the n-drain region 75 in the middle of the high voltage JFET 70 to the start-up auxiliary circuit 90 through the n-source region 73 disposed on the periphery and charges the power supply capacitor 56 through the VCC. The control circuit 53 starts operating when the power supply capacitor 56 has reached a prescribed voltage.

The current following through the high voltage JFET 70 increases the potential (source potential) of the n-source region 73 of the high voltage JFET 70, which causes a pn junction 89 of the n-source region 73 and the p-gate region 72, which is formed so to surround the source, to become reverse biased. This reverse bias causes a depletion region to spread to the n-source region 73 and the n-drift region 74. The depletion region 95 that has spread from the gate region 72, which is on both sides of the n-source region 73, to the n-source region 73 and the n-drift region 74 connects at a pinch-off point P in the n-drift region 74 surrounded by both sides of the p-gate region 72, thereby pinching off the high voltage JFET 70 (causing the JFET 70 to be in a cutoff state). Thus, the potential of the n+ source region 77 changes the spread of the depletion region and the constant current value. If the cut-off voltage is high, current will stop flowing, and the high voltage JFET 70 will turn OFF. Until this cut-off state is completely met, cut-off current flowing through the high voltage JFET 70 will remain at a uniform level and flow from the n+ source layer 77 to a drain D of the JFET 91 in the start-up auxiliary circuit 90 through the first source electrode 83 and the second source electrode wiring line 86.

FIG. 11 is a view that explains a state in which the high voltage JFET 70 has been pinched off. The depletion region 95, which has spread from the p-gate layer 72 to the n-drift layer 74, causes the drain current to be uniform. The depletion region 95 connects when the potential of the n-source region 73 increases, and this pinches off the high voltage JFET 70 and stops the drain current from flowing even if the drain voltage is increased, thereby causing the high voltage JFET 70 to turn OFF. The drain current remains uniform and does not increase. The area where the depletion region 95 has connected is the pinch-off point P. The voltage at the time of pinch-off is called the cutoff voltage Vcut, and the current is called the cutoff current Icut.

The cutoff current Icut initially flows to the power supply capacitor 56 from the VCC terminal. As the power supply capacitor 56 becomes gradually charged, however, the current that is charging the power supply capacitor 56 falls below the cutoff current Icut, and the switching power supply device 500 begins operating when the power supply capacitor 56 has reached a prescribed power supply voltage. At this point, current is supplied from the power supply capacitor 56 to the control circuit 53, and the voltage of the power supply capacitor 56 decreases. To compensate for this decrease, current is supplied to the power supply capacitor 56 from the high voltage input terminal VH through the high voltage JFET 70, the JFET 91, and the VCC terminal, and the power supply capacitor 56 maintains a uniform voltage while the switching power supply device 500 is operating. If the cutoff voltage Icut of the high voltage JFET 70 is low, however, the current supplied to the power supply capacitor 56 decreases, and it becomes impossible to maintain a uniform voltage of the power supply capacitor 56.

When assembling the switching power supply device 500, an ESD (electrostatic discharge) surge is sometimes introduced to the high voltage JFET 70. There are two types of ESD surges: the Human Body Model (HBM±), and the Machine Model (MM±).

In regards to MM− and HBM−, a large parasitic diode formed of the n-source region 73, the n-drift region 74, the n-drain region 75, and the p-substrate 71 becomes forward biased, and the high voltage JFET 70 itself can protect against the negative ESD surge. MM+ is a low voltage of approximately 200V, and thus the high-voltage JFET 70 can also protect against this ESD surge.

HBM+, however, is at least approximately 1000V to 2000V; therefore, it is difficult for the high voltage JFET 70 alone to protect against this ESD surge.

Patent Document 1 discloses a horizontal junction field effect transistor in which the drain is disposed in the center and a large number of sources surround the transistor.

Patent Documents 2 and 3 disclose resistor elements for detecting input voltage being formed in parallel from an input pad electrode, with these resistor elements being arranged in an interlayer insulating film on the drain region.

RELATED ART DOCUMENTS

Patent Documents

Patent Document 1: Japanese Patent Application Laid-Open Publication No. 2007-12659
Patent Document 2: Japanese Patent Application Laid-Open Publication No. 2008-153636
Patent Document 3: Japanese Patent Application Laid-Open Publication No. 2008-130733

SUMMARY OF THE INVENTION

In order to protect the control circuit 53 from ESD surges with the high voltage JFET 70, there are methods in which an ESD protection element is provided with the high voltage JFET 70.

One such method includes forming a thick insulating layer on the high-voltage JFET 70, forming the ESD protection element on this insulating layer, and this connecting this ESD protection element in parallel to the high voltage JFET 70. This method, however, has a complicated process and increases costs. Another method is to form the ESD protection element in a location that is separate from the high voltage JFET 70. This method, however, increases the chip size.

In order to solve these problems, it is necessary to increase the ESD capacity of the high voltage JFET 70 and make the high voltage JFET 70 itself have a protective function against ESD surges.

There are two methods to improve the ESD capacity of the high voltage JFET 70. One method is to increase the resistance of the n-drift region 74 and divide the ESD surge voltage with the drift region. The other method is to increase the source breakdown voltage.

There are various methods in order to increase the resistance of the first n-drift region 74, such as (1) increasing the length of the n-drift region 74, or (2) lowering the impurity concentration of the n-drift region 74 and increasing the resistance of the n-drift region 74.

These two methods both have the effect of improving ESD capacity by weakening electric field intensity at the pn junction 89 of the p-gate region 72, which is the gate, and the n-source region 73 when an ESD surge has been inputted.

If the length of the n-drift region 74 is increased, however, the device size of the high voltage JFET 70 becomes larger, and thus the chip size also becomes larger. On the other hand, when the impurity concentration of the n-drift region 74 is lowered, the cutoff voltage Vcut of the high voltage JFET 70 decreases, which makes the cutoff current Icut smaller. Thus, the current flowing to the power supply capacitor 56 through the start-up auxiliary circuit 90 becomes insufficient, and the power supply capacitor 56 is unable to be charged anymore. This lowers the voltage of the power supply capacitor 56 and destabilizes the operation of the control circuit 53.

The second method of increasing the source breakdown voltage involves lowering the impurity concentration of the p-gate region 72 and increasing avalanche resistance Vav of the pn junction 89.

With this method, however, the spread of the depletion region becomes larger on the p-diffusion region 72 side, and the portion of the depletion region spreading towards the n-source region 73 becomes narrower. Thus, the cutoff voltage Vcut of the high voltage JFET 70 during normal use is increased and exceeds the breakdown voltage of the JFET 70, which forms a portion of the start-up auxiliary circuit 90 connecting to the n-source region 73.

FIGS. 12A and 12B are views of a method of measuring ESD resistance and the electric field intensity distribution in the high voltage JFET 70. FIG. 12A explains the method of measuring, and FIG. 12B shows the electric field intensity distribution of the high voltage JFET 70 on the line X-X. The measuring of the ESD resistance involves causing a positive terminal probe 97a of an ESD pulse generator 96 to contact the second drain electrode wiring line 87 of the high voltage JFET 70, and causing a negative terminal probe 97b to contact a common ground pad 98 of the control circuit 53. The gate electrode wiring line 82 connects to the common ground pad 98. The ESD resistance is found by applying an ESD surge to the high voltage JFET 70 from the ESD pulse generator 96 and measuring the voltage at which the high voltage JFET 70 breaks down.

At this time, the electric field intensity at the pn junction 89 of the p-gate region 72 and the n-source region 73 is highest, and the electric field intensity at the pinch-off point P is lower than this. The depletion region spreads over the entire n-drift region 74 and enters into the n-drain region 75.

As described above, there are two modes to protect against ESD surges: MM± and HBM±. MM± is Machine Mode and is approximately 200V, and HBM± is Human Body Mode and is approximately 1000V to 2000V.

Therefore, as shown in FIGS. 12A and 12B, the ESD resistance test of the high voltage JFET 70 involves applying an ESD surge voltage to the n-drain region 75 with the p-gate region 72 as ground. The surge voltage is increased in 100V ticks to measure the breakdown voltage of the high voltage JFET 70, for example. The voltage of the 100V tick immediately preceding the measured breakdown voltage (=breakdown voltage−100V) is the ESD resistance. The breakdown of the high voltage JFET 70 occurs when the loss generated by the product of the avalanche current and the avalanche voltage when this avalanche current is flowing becomes excessive. Therefore, the breakdown voltage is the avalanche voltage at the time of breakdown, and the ESD capacity is the avalanche voltage immediately preceding breakdown.

The breakdown region of the high voltage JFET 70 caused by the ESD surge is the pn junction 89 of the n-source region 73 and the p-gate region 72, and the electric field is concentrated at this region. This is because the avalanche voltage Vav of the pn junction 89 at this region is lower than the avalanche voltage of the p-gate region 72 and the n-drift region 74, and thus the pn junction 89 of this region enters the avalanche first.

FIG. 13 is a view of the relationship between the length of the n-drift region 74 and ESD capacity. A length L of the n-drift region is approximately equal to the gap between the n+ source region 77 and the n+ drain region 78. If the length L of the n-drift region 74 is increased, the range of the depletion region spreads, and thus the electric field intensity at the pn junction 89 decreases and ESD capacity is improved.

FIGS. 14A and 14B show the relationship between the current flowing to the high voltage JFET 70 and the applied voltage. FIG. 14A shows a voltage applied to the drain with the gate and the source as ground, and FIG. 14B shows the avalanche voltage Vav when a voltage is applied to the drain with the gate as ground (i.e., the source is floating and not connected to ground). In FIG. 14A, it is necessary to investigate the cutoff voltage Vcut and the cutoff current Icut. Although not shown, during actual operation, the current increases until the cutoff voltage Vcut, but once the cutoff voltage Vcut is exceeded, the cutoff current Icut becomes uniform. In actual operation, however, when the cutoff current Icut is supplied to the power supply capacitor 56 and the voltage of the power supply capacitor 56 increases, the current becomes smaller. The avalanche voltages Vav shown in FIG. 14B is the ESD capacity of the respective high voltage JFETs 70 (A, B, C, and D).

A is a reference high voltage JFET with a conventional structure, B is a high voltage JFET with a conventional structure in which the length L of the n-drift region is longer than in A, C is a high voltage JFET with a conventional structure in which the n-drift region has a lower concentration than A, and D is a high voltage JFET with a conventional structure in which the p-diffusion region of the gate has a lower concentration than A.

In A, the proportion of voltage divided at the n-drift region is low, and the proportion of voltage divided at the pn junction of the source and the p-diffusion region of the gate is high; therefore, ESD breakdown occurs on the source side, and ESD capacity is low.

In B, the resistance increases in proportion to the length of the n-drift region, the proportion of the voltage divided at the n-drift region is high, and the proportion of voltage divided at the pn junction of the source and the drift is low. Therefore, ESD breakdown on the source side can be suppressed, but the device size becomes larger.

In C, the impurity concentration of the n-drift region is low, and the avalanche breakdown voltage of the pn junction of the n-drift region and the p-diffusion region of the gate is high. Therefore, ESD capacity is improved.

The cutoff voltage Vcut, however, becomes lower, and the cutoff voltage Icut flowing to the source becomes smaller. Therefore, there is a risk that the operation of the start-up auxiliary circuit could become destabilized.

In D, the impurity concentration of the p-diffusion region of the gate is low; therefore, the cutoff voltage Vcut is high, and the cutoff current Icut also becomes high. Furthermore, the source breakdown voltage increases and the ESD capacity is improved, but the scope of improvement is narrow, which makes it difficult to attain a high ESD capacity.

If the respective cutoff voltages Vcut in A, B, C, and D are P1, P2, P3, and P4, and the respective cutoff currents Icut are I1, I2, I3, and I4, then P1<P2, P3<P1, P1<P4, and I1=I2, I3<I1, and I1<I4.

If the ESD surge capacity (=the avalanche voltage Vav immediately preceding breakdown) in A, B, C, and D is V1, V2, V3, and V4, respectively, then V4<V1<V3<V2, and V3 and V2 can be an ESD guaranteed value of at least 2000V. As described above, however, A has low ESD capacity, B has a large device chip, C has a small cutoff current Icut, and D has a low ESD capacity.

Patent Documents 1 to 3 do not disclose the floating region according to the present invention being provided on the surface layer of the drift region.

The present invention aims at solving the above-mentioned problems by providing a high voltage junction field effect transistor that can improve ESD capacity without increasing device size or making the cutoff current smaller.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a junction field effect transistor, including: a second conductivity type drain region formed in a surface of a first conductivity type semiconductor region; a second conductivity type drift region contacting the drain region and formed in the surface of the semiconductor region; a second conductivity type source region contacting the drift region and formed in the surface of the semiconductor region separated from the drain region; an interlayer insulating film formed on the semiconductor region; and a first conductivity type floating region formed in a surface of the drift region separated from the source region, the floating region being electrically floating.

It is preferable that the drift region and the source region formed surrounding the drain region.

It is preferable that the source region be made of a plurality of regions, and that the semiconductor region or a first conductivity type gate region having a higher impurity concentration than the semiconductor region be provided between the plurality of regions forming the source region.

It is preferable that the above-mentioned configuration further include a resistor element disposed inside the interlayer insulating film.

It is preferable that the resistor element is made of polysilicon and has a coil-like shape in a plan view.

It is preferable that the resistor element electrically connect to the drain region.

In one aspect, the present disclosure provides a junction field effect transistor, including: a second conductivity type drift region disposed in a surface of a first conductivity type semiconductor substrate; a second conductivity type drain region contacting the drift region; a second conductivity type source region that contacts a side of the drift region opposite to the drain region; a first conductivity type gate region contacting the source region and the drift region; a second conductivity type drain contact region that is disposed on a surface of the drain region and that has a higher impurity concentration than the drain region; a second conductivity type source contact region that is disposed on a surface of the source region and that has a higher impurity concentration than the source region; a first conductivity type gate contact region that is disposed on a surface of the gate region and that has a higher impurity concentration than the gate region; an insulating film disposed on the drift region, the drain region, and the source region, the insulating film exposing the drain contact region, the source contact region, and the gate contact region; a polysilicon gate electrode disposed on the insulating film; a first interlayer insulating film covering the insulating film and the polysilicon gate electrode; a drain electrode disposed on the first interlayer insulating film and connecting with the drain contact region; a source electrode disposed on the first interlayer insulating film and connecting with the source contact region; a gate electrode wiring line disposed on the first interlayer insulating film and connecting with the gate contact region and the polysilicon gate electrode; a second interlayer insulating film covering the first interlayer insulating film, the first drain electrode, the first source electrode, and the gate electrode wiring line; a drain electrode wiring line disposed on the second interlayer insulating film and connecting with the drain electrode; a source electrode wiring line disposed on the second interlayer insulating film and connected with the source electrode; and a first conductivity type floating region formed in a surface of the drift region, the floating region being electrically floating.

It is preferable that the floating region be formed separated from the source region and the drain region.

It is preferable that the above-mentioned configuration further include a resistor element made of polysilicon disposed inside the first interlayer insulating film, the resistor element having an end thereof electrically connected to the drain electrode.

It is preferable the drain contact region have a circular shape in a plan view, that the drain region be provided so as to be in a concentric circle with the drain contact region in a plan view, that the floating region be provided in a ring shape surrounding the drain region, and that the gate region surround the drift region and contacts the drift region.

The present invention can provide a high voltage junction field effect transistor that can improve ESD capacity without increasing device size or making the cutoff current smaller.

It is to be understood that both the foregoing general description and the following detailed description are exemplary and explanatory, and are intended to provide further explanation of the invention as claimed.

BRIEF DESCRIPTION OF THE DRAWINGS

FIG. 2A is a cross-sectional view of main parts in FIG. 1 cut along the line A-O, and FIG. 2B is a cross-sectional view of main parts of FIG. 1 cut along the line B-O.

FIG. 4A is a cross-sectional view of main parts of the high voltage JFET 100 in FIG. 2A, and FIG. 4B is a view of electric field intensity distribution in FIG. 2A on line X-X.

FIG. 5A is a view of when voltage is applied to the drain with the gate and source as ground, and FIG. 5B is a view of avalanche voltage when voltage is applied to the gate and drain.

FIG. 6A is a plan view of main parts of the high voltage JFET 100, and FIG. 6B is a cross-sectional view of main parts in FIG. 6B cut along the line A-O.

FIG. 7A is a cross-sectional view of main parts of the junction field effect transistor 300, and FIG. 7B is a cross-sectional view of main parts of FIG. 7A cut along the line C-C'.

FIG. 10A is a plan view of main parts of the conventional high voltage JFET 70, and FIG. 10B is a cross-sectional view of main parts in FIG. 10B cut along the line A-O.

FIG. 12A is a view for explaining the method of measuring ESD capacity, and FIG. 12B is a view of the electric field intensity distribution of the high voltage JFET 70 on the line X-X.

FIG. 14A is a view of when voltage is applied to the drain with the gate and source as ground, and FIG. 14B is a view of avalanche voltage Vav when voltage is applied to the gate and drain.

DETAILED DESCRIPTION OF EMBODIMENTS

Embodiments of various aspects of the present invention will be described below. In the explanations below, n indicates n-type conductivity and p indicates p-type conductivity. A "+" added to either of these indicates that the impurity concentration thereof is high.

Embodiment 1

Figure 1:
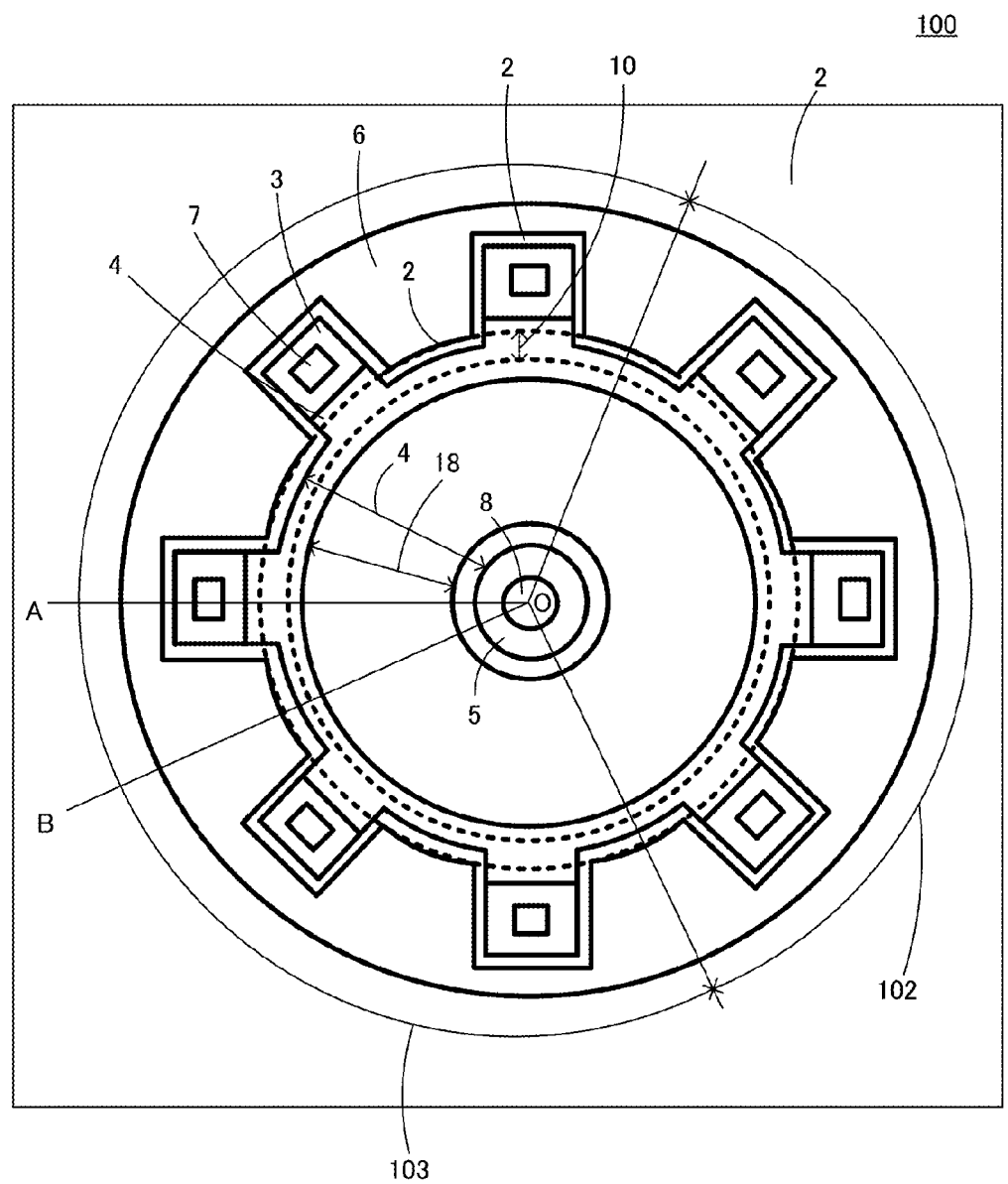
FIG. 1 is a plan view of main parts of a high voltage JFET 100 of Embodiment 1 according to one aspect of the present invention.
Figure 2A:
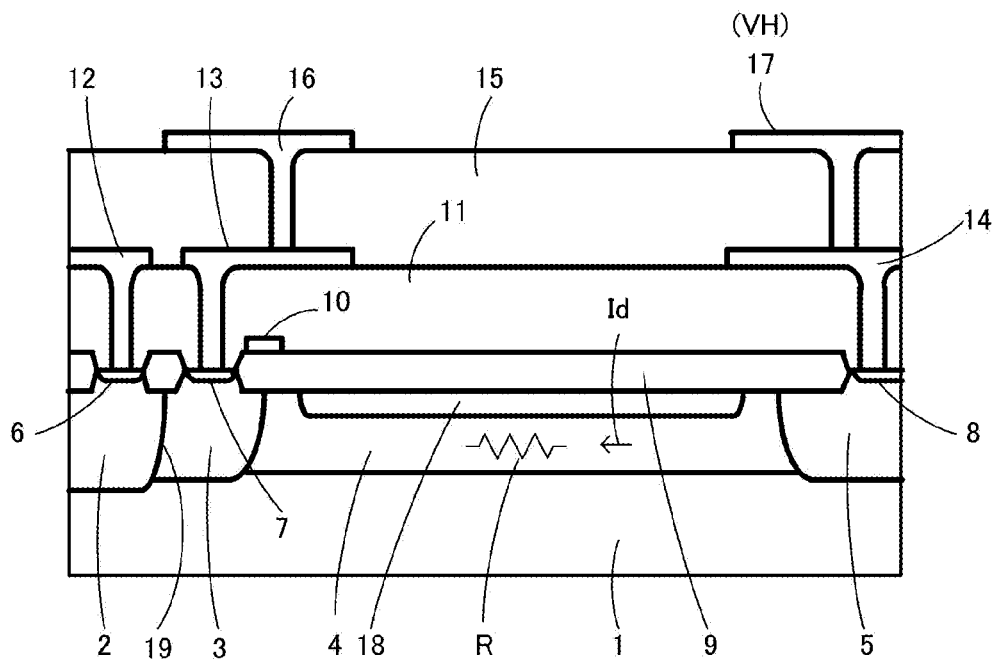
FIGS. 2A and 2B are cross-sectional views of FIG. 1.
Figure 2B:
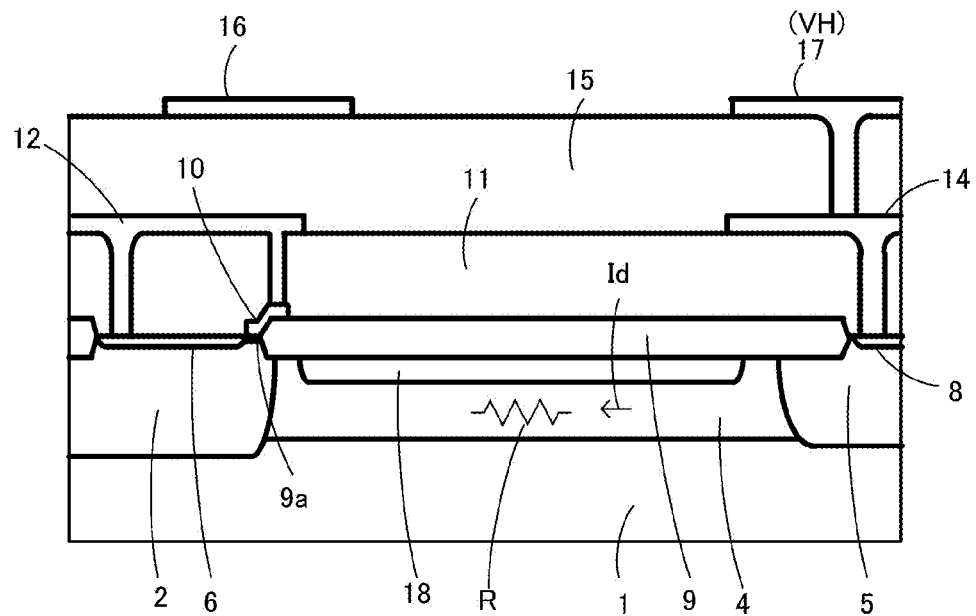

FIG. 1 and FIGS. 2A and 2B are each a view of a configuration of a high voltage JFET 100 of Embodiment 1 according to one aspect of the present invention. FIG. 1 is a plan view of main parts of the high voltage JFET 100, FIG. 2A is a cross-sectional view of the main parts in FIG. 1 cut along the line A-O, and FIG. 2B is a cross-sectional view of the main parts of FIG. 1 cut along the line B-O. The high voltage JFET 100 is formed on a semiconductor region constituted of a semiconductor substrate 1. The high voltage JFET 100 is constituted of a first JFET part 102 and a second JFET part 103.

Figure 3:
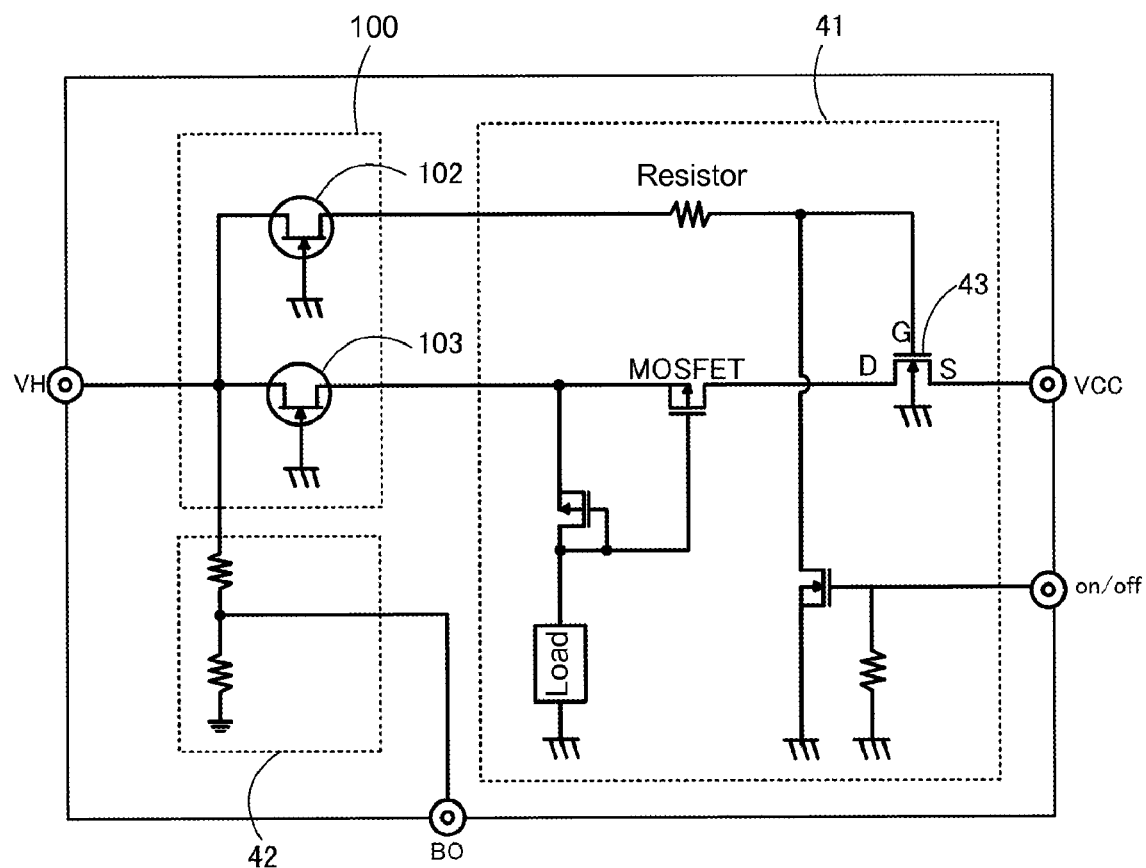
FIG. 3 is a view of a configuration of a start-up circuit.
Figure 9:
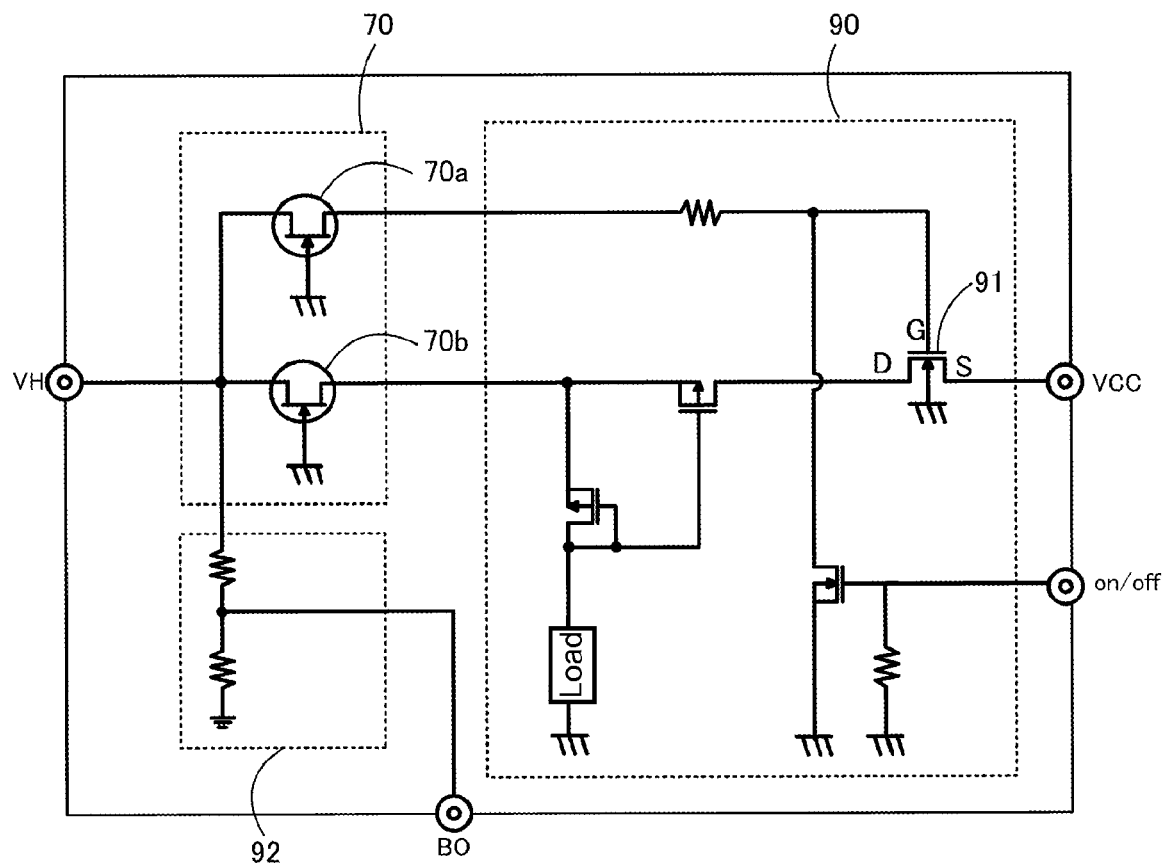
FIG. 9 is a circuit diagram of a start-up circuit 60, which forms a part of a control circuit 53 in FIG. 8.
Figure 10A:
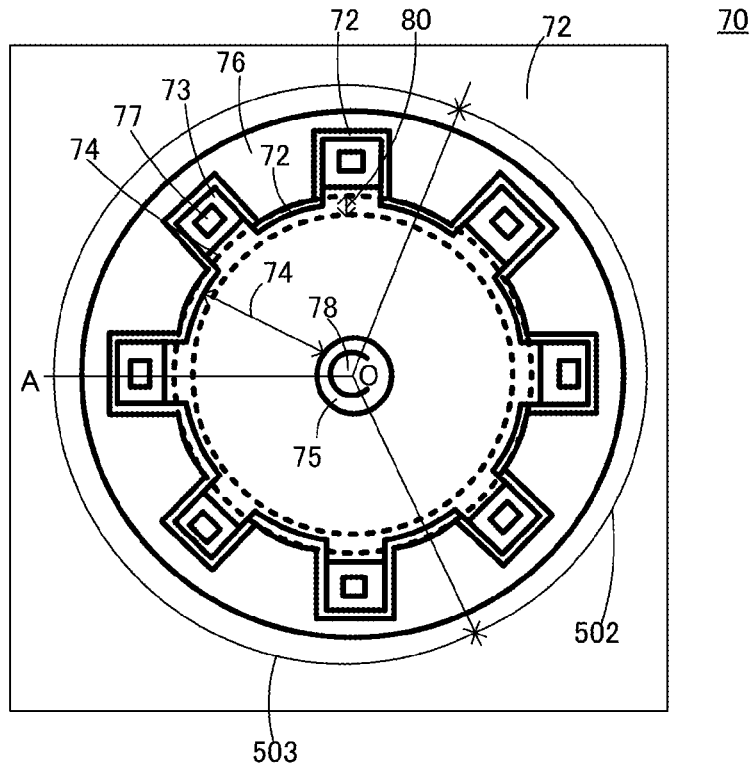
FIGS. 10A and 10B are views of a configuration of a conventional high voltage JFET 70.
Figure 10B:
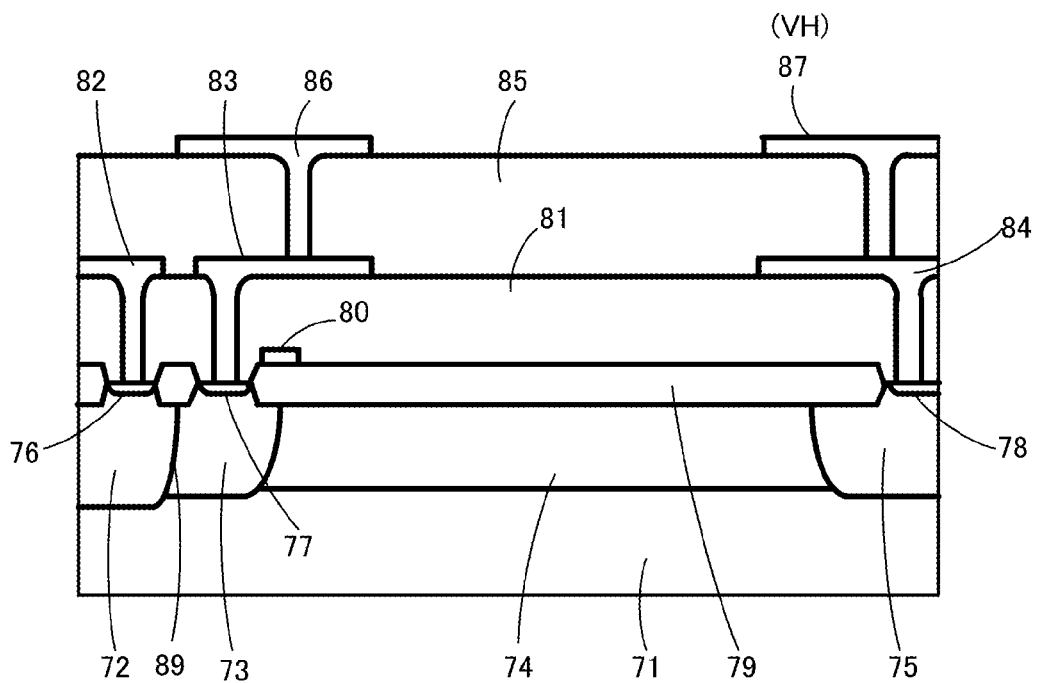
Figure 11:
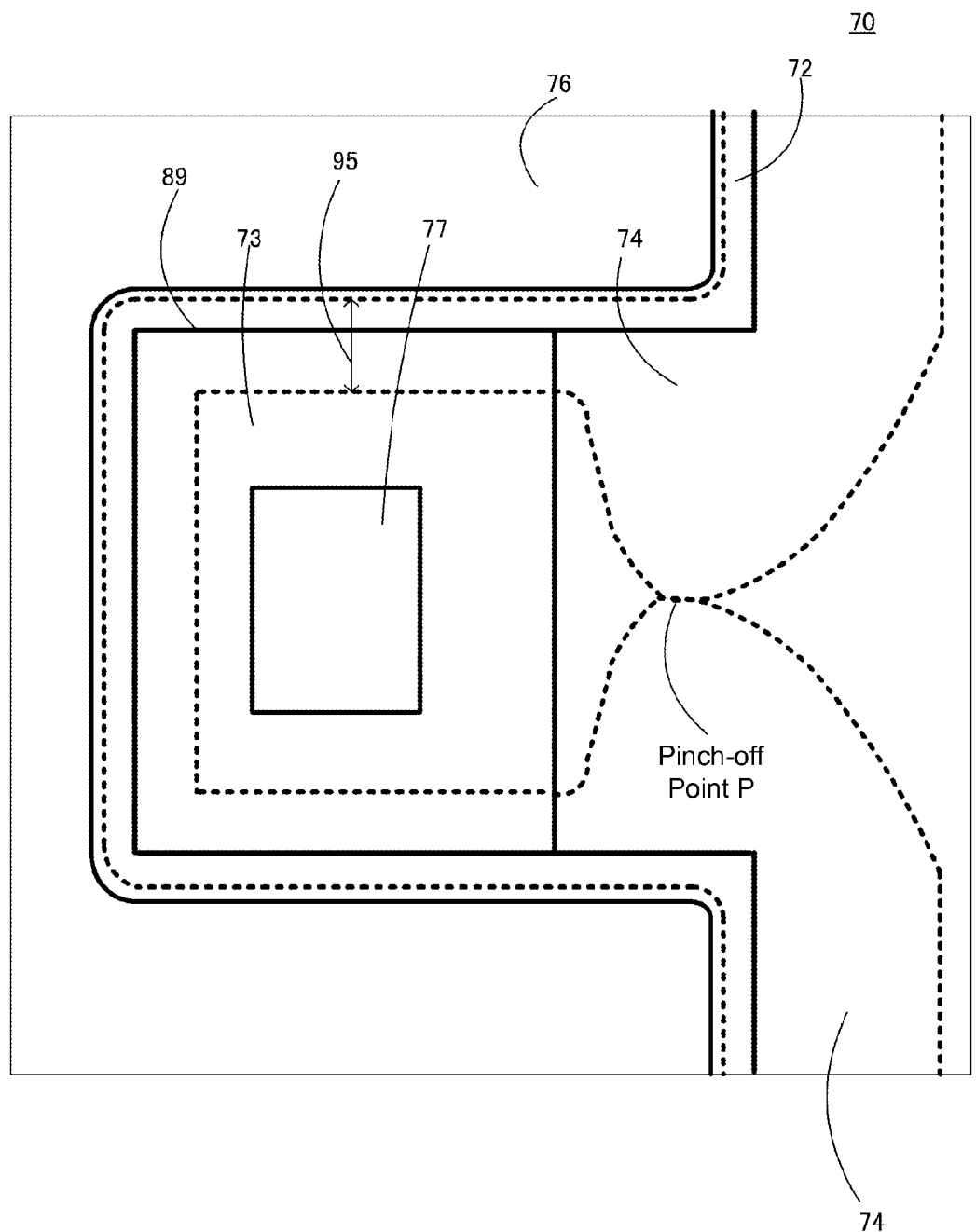
FIG. 11 is a view for explaining a state in which the high voltage JFET 70 has been pinched off.
Figure 12A:
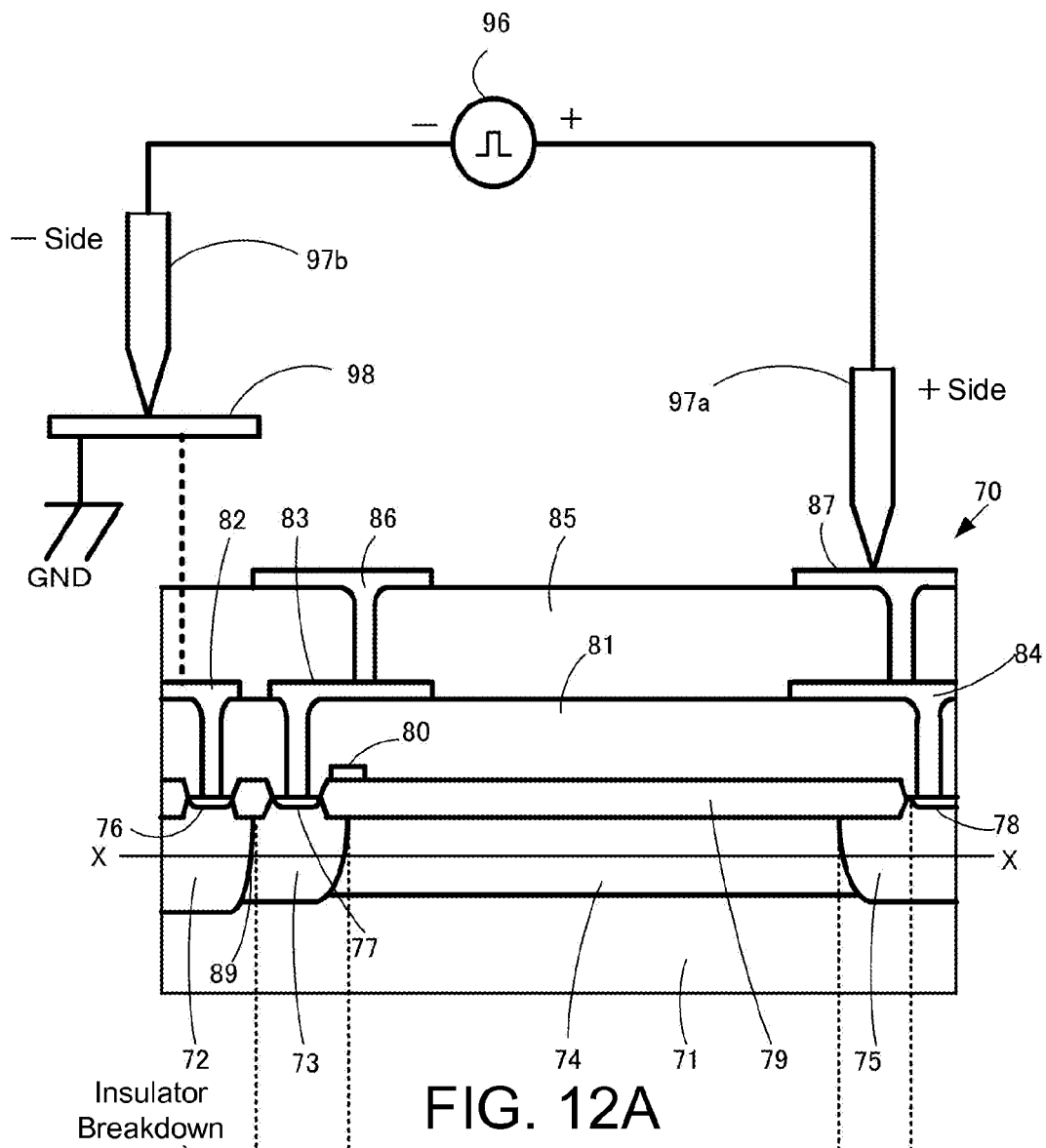
FIGS. 12A and 12B are views of a method of measuring ESD capacity, and electric field intensity distribution in the high voltage JFET 70.
Figure 12B:
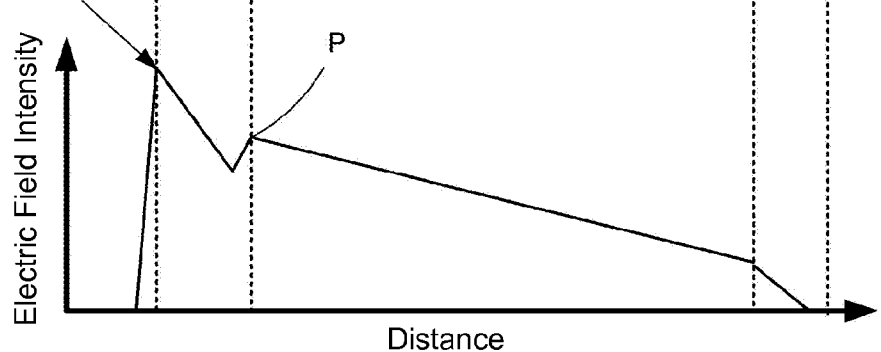
Figure 13:
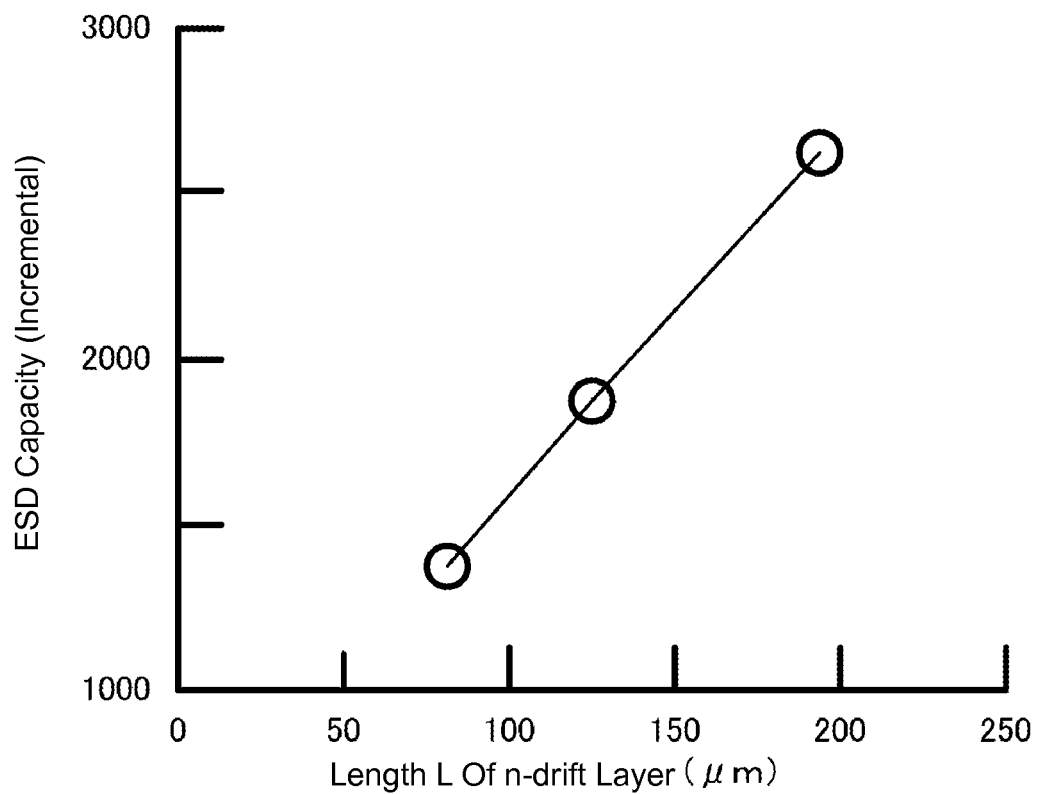
FIG. 13 is a view of the relationship between the length of an n-drift region 74 and ESD capacity.
Figure 14A:
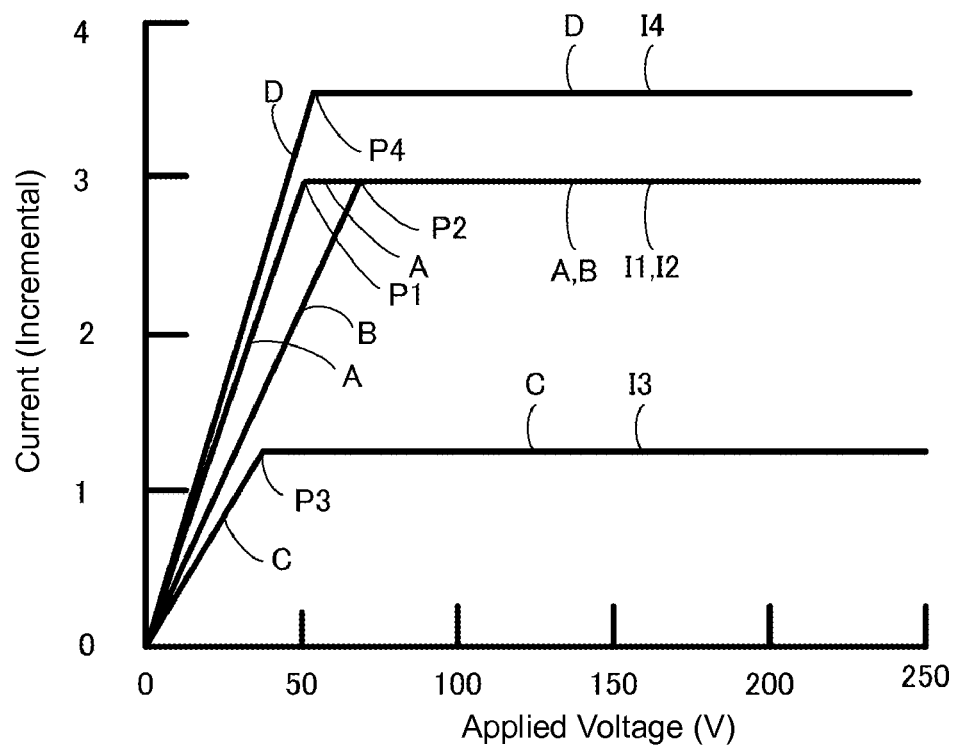
FIGS. 14A and 14B show a relationship between current flowing to the high voltage JFET 70 and applied voltage.
Figure 14B:
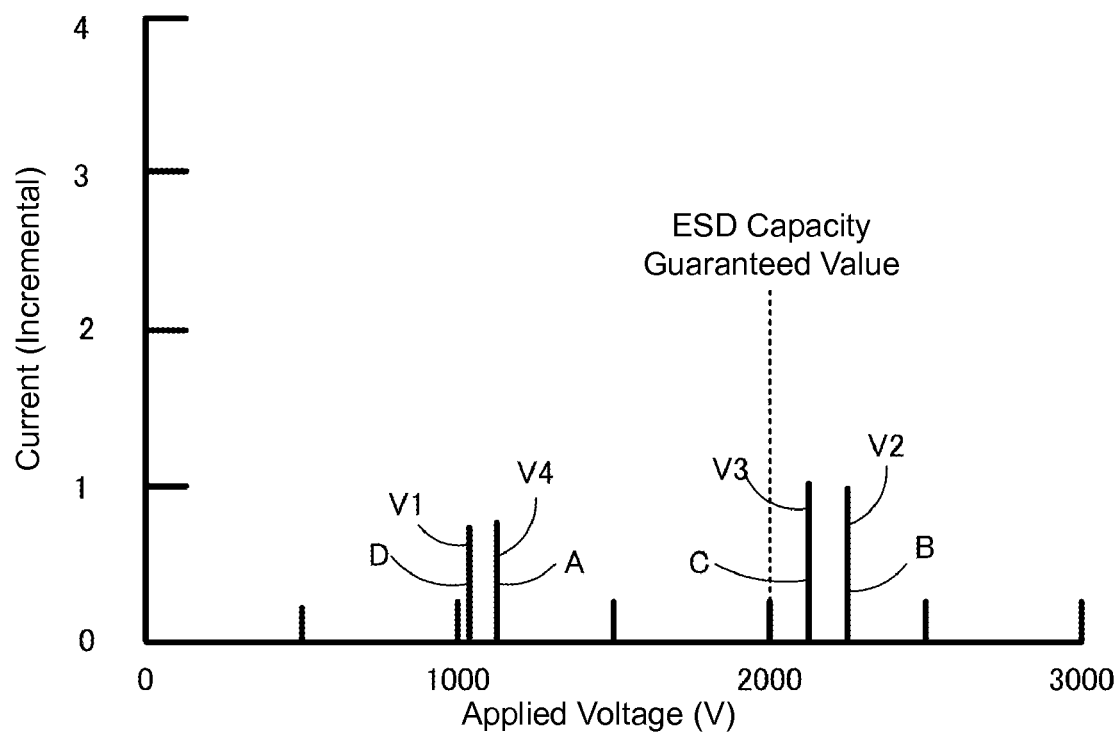

FIG. 3 is a view of a configuration of a start-up circuit 40. This start-up circuit 40 is equivalent to the start-up circuit 60 in FIG. 9. The start-up circuit 40 is constituted of the high voltage JFET 100, a start-up auxiliary circuit 41 (also called the start-up internal circuit), and a resistor circuit 42. The high voltage JFET 100 includes two parts: the first JFET part 102 and the second JFET part 103. The respective sources of the high voltage JFET parts 102 and 103 are connected to the gate and drain of a JFET 43 in the start-up auxiliary circuit 41 through a resistor and a MOSFET, and the source of the JFET 43 is connected to the VCC terminal. The resistor circuit 42 is equivalent to the resistor circuit 92 of FIG. 9 and is connected to a high voltage input terminal VH, a BO terminal, and ground.

In FIGS. 1 and 2, the high voltage JFET 100 includes, on a p-substrate 1, a p-gate region 2, an n-source region 3 surrounded on three sides by the p-gate region 2, an n-drift region 4 that connects to the n-source region 3, and an n-drain region 5 that connects to the n-drift region 4. The JFET 100 further includes a p+ gate region 6 (gate contact region), which is a p-contact region disposed on the surface layer of the p-gate region 2, an n+ source region 7 (source contact region), which is an n-contact region disposed on the surface layer of the n-source region 3, and an n+ drain region 8 (drain contact region), which is an n-contact region disposed on the surface layer of the n-drain region 5. A LOCOS oxide film 9 is disposed on the n-source region 3, the n-drift region 4, the n-drain region 5, and interposed between the n+ source region 7 and the n+ drain region 8. The LOCOS oxide film 9 and a polysilicon gate electrode 10 on a thin oxide film 9a act as a mask of the p+ gate region 6 for the n+ source region 7 and the n+ drain region 8. The JFET 100 also includes a first interlayer insulating film 11 provided on the LOCOS oxide film 9 and covering this film. The first interlayer insulating film 11 also covers a polysilicon electrode 10 disposed on the LOCOS oxide film 9 and connected to the gate electrode wiring line 12. The polysilicon gate electrode 10 is electrically insulated from the p-gate region 2 by the thin oxide film 9a. This is because when the polysilicon gate electrode 10 contacts the p-gate region 2, the depletion region spreading to the p-gate region 2 reaches the p+ gate region 6 at a low voltage, thereby lowering ESD capacity. The JFET 100 also includes a metal (aluminum, silicon, or the like) gate electrode wiring line 12 connected to the p+ gate region 6, a metal (aluminum, silicon, or the like) silicon electrode 13 connected to the n+ source region 7, and a metal (aluminum, silicon, or the like) drain electrode 14 connected to the n+ drain region 8, and these are disposed on the first interlayer insulating film 11. The high voltage JFET 100 further includes a second interlayer insulating film 15 disposed on the first interlayer insulating film 11, a source electrode wiring line 16 disposed on the second interlayer insulating film 15 and connected to the source electrode 13, and a drain electrode wiring line 17 (drain pad electrode/VH terminal) connected to the drain electrode 14. The JFET 100 also includes a p-floating region 18 disposed on the surface layer of the n-drift region 4 separated from the n-source region 3 and the n-drain region 5.

Although not shown in FIG. 1, the high voltage JFET 100 has the one drain electrode wiring line 17 (connected to the n+ drain region 8) at the center thereof, and two of the source electrode wiring lines 16 (connected to the n+ source region 7) and the gate electrode wiring line 12 (connected to the p+ gate region 6) are around the high voltage JFET 100. There are three n+ source regions 7 (first JFET part 102) or five n+ source regions 7 (second JFET 103) connected to each source electrode wiring line 16. Electrode wiring line refers both to the electrode and the wiring line that connects to the electrode.

The p-floating region 18 is electrically floating, and the dosage thereof is approximately $5 \times 10^{11}$ cm$^{-2}$ to $2 \times 10^{12}$ cm$^{-2}$ with a depth of approximately 2 µm. The dosage of the n-drift region 4 is approximately $1 \times 10^{12}$ cm$^{-2}$ with a depth of approximately 8 µm. Therefore, the impurity concentration of the p-floating region 18 is two to four times higher than the impurity concentration of the n-drift region 4.

The drain electrode wiring line 17, the drain electrode 14, the n+ drain region 8, and the n-drain region 5 are each arranged in the center of the JFET 100, and the center of each of these has the same circular shape (each is a concentric circle). The inner edge (center side) of the n-drift region 4 contacts the n-drift region 5, and the outer edge (peripheral side) contacts the P-gate region 2 and the source region 3.

The p-gate region 2 has a circular-shaped periphery, and the inner edge of the p-gate region 2 has recesses and protrusions. The n-source region 3 is disposed so as to enter these recesses, and the end thereof facing the n-drain region 5 contacts the n-drift region 4. As described above, the p-floating region 18 is disposed on the surface layer of the n-drift region 4 separated from the n-source region 3 and the n-drain region 5, and as described above, the p-floating region 18 is electrically floating.

By providing the p-floating region 18, current Id flowing through the n-drift region 4 will flow to a deep area without flowing to the surface layer. This deep area has an impurity concentration lower than the surface layer and has a current path that narrows in the vertical direction; thus, resistance R in the horizontal direction increases. As a result, the proportion of voltage divided at the n-drift region 4 increases, and the proportion of voltage divided at a pn junction 19 of the p-gate region 2 and the n-source region 3 decreases. ESD capacity is improved by the voltage divided at the pn junction 19 becoming lower (this means suppressing a rise in the source potential).

By providing the p-floating region 18, the depletion region is more susceptible to spreading to the n-drift region 4 directly below this p-floating region 18, which lowers the electric field intensity of the pn junction 19 of the p-gate region 2 and the n-source region 3. Therefore, ESD capacity is improved.

Furthermore, due to the p-floating region 18 being disposed on the n-drift region 4, the device size (the size of the high voltage JFET 100) does not increase.

By using a conventional structure for the p-gate region 2 and the n-source region 3 forming the pn junction 19, the cutoff current Icut can be the same as in a conventional configuration.

Furthermore, this p-floating region 18 is formed at the same time as the p-offset region and p-well region of other circuit elements (such as a horizontal MOSFET, for example) (not shown), thereby making it possible to suppress a rise in manufacturing costs.

The p-floating region 18 is structurally similar to a RESURF structure, but the aim is fundamentally different: the p-floating region 18 increases the resistance R in the horizontal direction of the n-drift region 4 and improves the spread of the depletion region, whereas a RESURF structure lowers the resistance and the ON resistance. Therefore, the p-floating region 18 may be divided into many different regions. There is a method of dividing in which the p-floating region 18 is made into a plurality of ring shapes surrounding the n-drain region 5, or divided into island shapes.

The p-floating region 18 may contact the n-drain region 5. On the other hand, the p-floating region 18 does not need to contact the n-source region 3, and can have a gap of approximately 20 μm, for example. This is because if the p-floating region 18 is close to the n-source region 3, the spread of the depletion region is affected and the cutoff current Vcut changes.

The present invention makes it possible to improve ESD capacity without increasing device size and without modifying the source structure. The ESD capacity can be raised to at least approximately 2000V, for example.

Figures 4A, 4B:
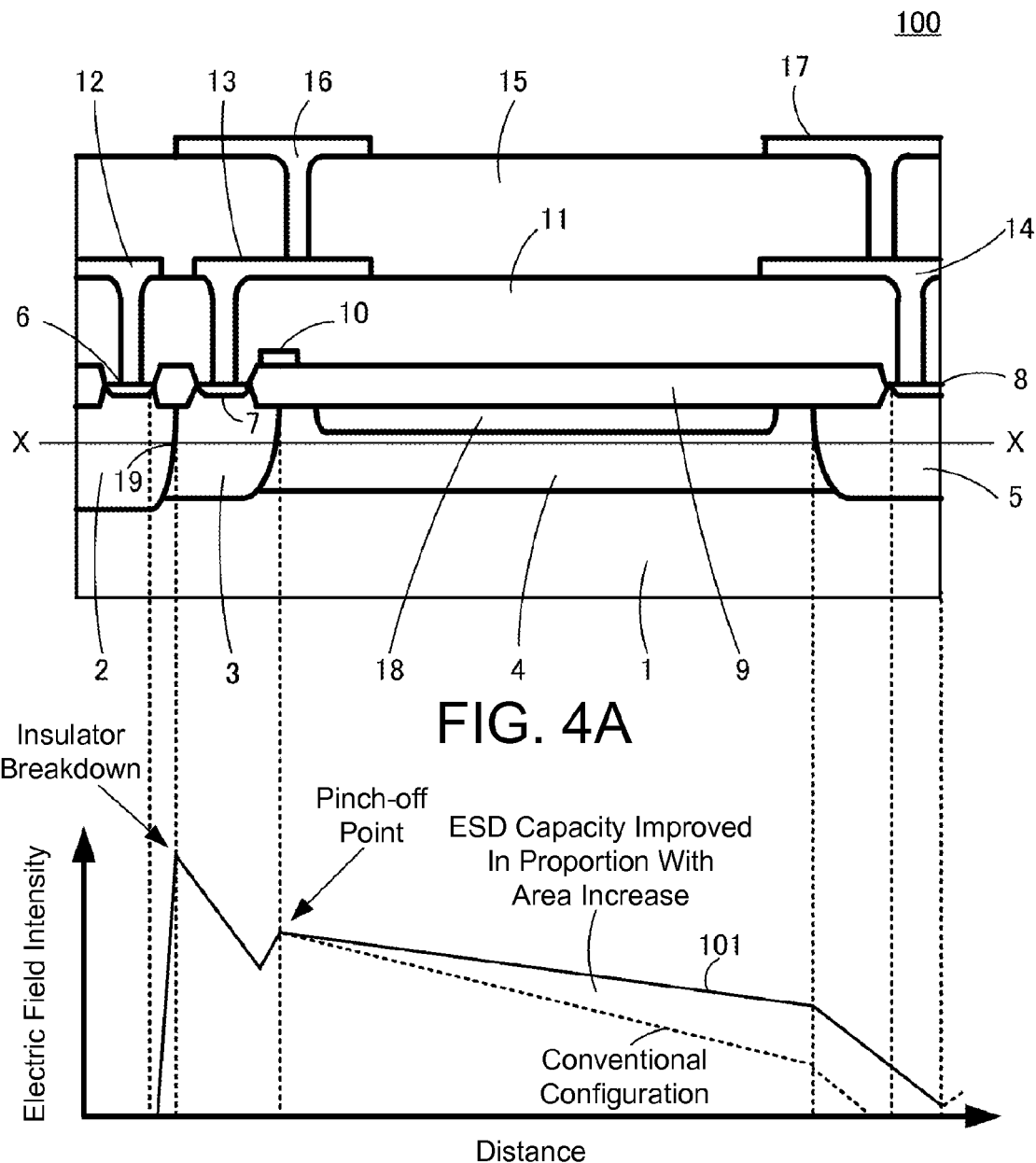
FIGS. 4A and 4B are views of electric field intensity distribution during ESD breakdown.

FIGS. 4A and 4B are views of electric field intensity distribution during ESD breakdown. FIG. 4A is a cross section of main parts of the high voltage JFET 100 in FIG. 2A, and FIG. 4B is a view of electric field intensity distribution in FIG. 2A on line X-X. The electric field intensity distribution of a conventional structure is also shown for reference with the dotted line. Insulation breakdown occurs where the electric field intensity of the pn junction 19 is highest. Moreover, the maximum electric field intensity occurs at the pinch-off point. When the electric field intensity reaches the insulation breakdown intensity of silicon (approximately $5 \times 10^5$ V/cm), ESD breakdown will occur.

In FIG. 4B, the integration value of the electric field intensity and the distance is the voltage applied during ESD breakdown. Compared to a conventional structure, the electric field intensity of the n-drift region 4 lowers more gradually. Thus, voltage increases in proportion to the increase in the integration value (surface area), and ESD capacity is improved.

Figure 5A:
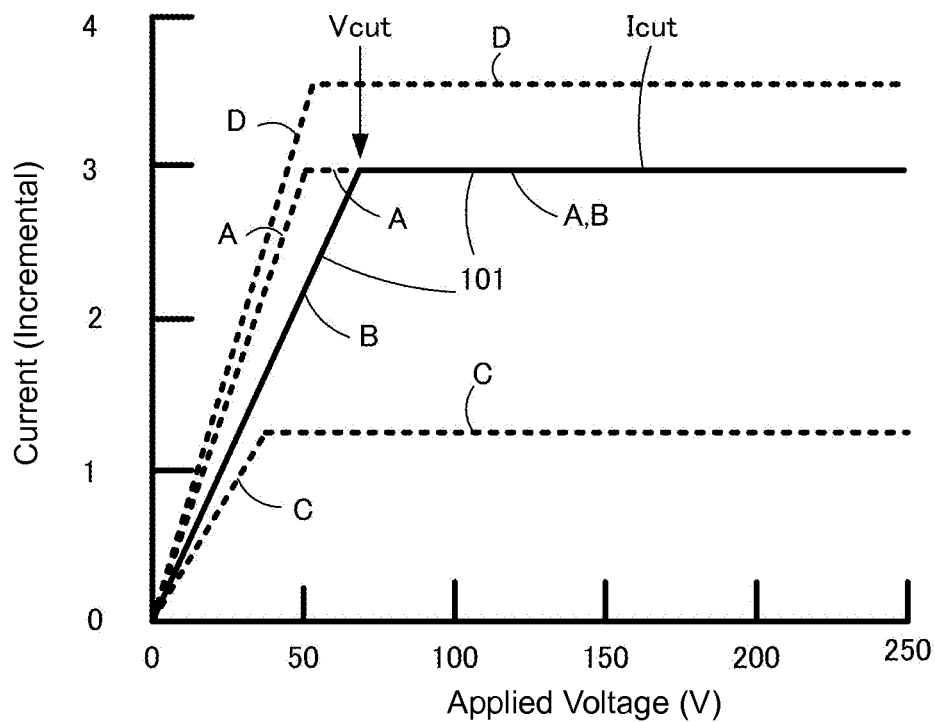
FIGS. 5A and 5B show a relationship between current flowing to the high voltage JFET 100 and applied voltage.
Figure 5B:
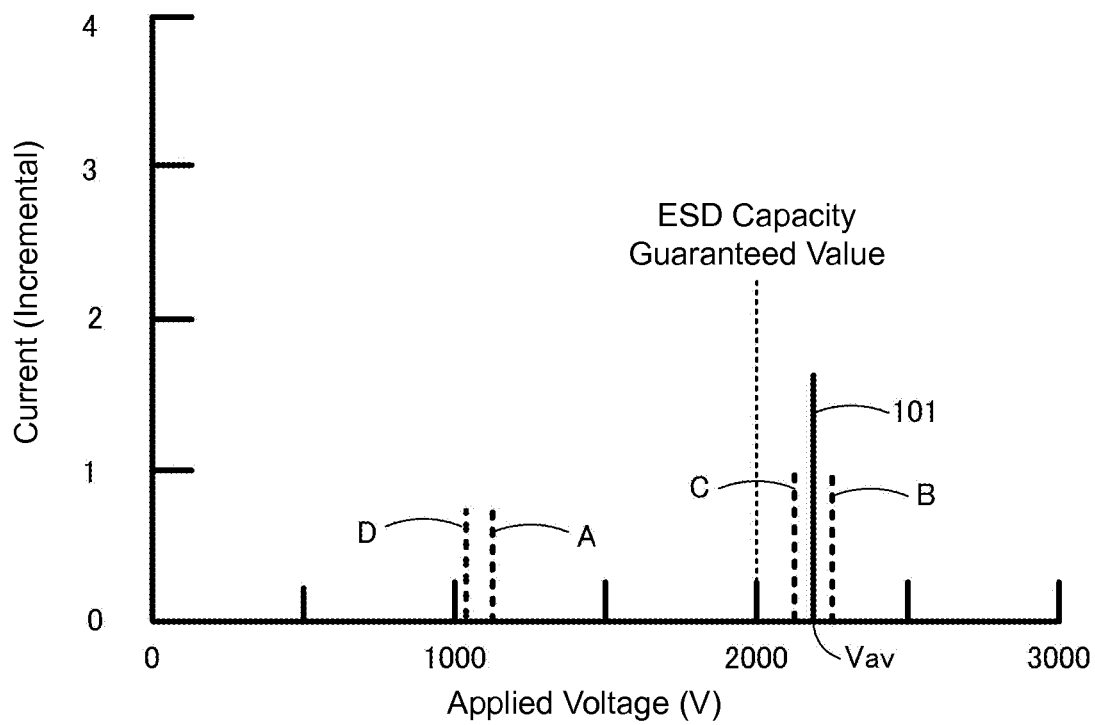

FIGS. 5A and 5B show a relationship between the current flowing to the high voltage JFET 100 and the applied voltage. FIG. 5A shows voltage applied to the ground with the gate and source as ground, and FIG. 5B the avalanche voltage Vav when voltage is applied to the gate and the drain (i.e., voltage is not applied to the source and the drain). The conventional structures (A, B, C, and D) are shown for reference with dotted lines in FIGS. 5A and 5B.

According to FIG. 5A, in the high voltage JFET 100, the cutoff current Icut is the same as the conventional configurations A and B, but the cutoff voltage Vcut rises. Meanwhile, according to FIG. 5B, the ESD surge capacity (the avalanche voltage Vav immediately preceding breakdown) is higher than the conventional configurations A and D. Thus, in the high voltage JFET 100 of the present invention, it is possible to attain an ESD capacity of at least 2000V. The avalanche voltage Vav is the voltage that the avalanche at the pn junction 19 generates. The avalanche voltage Vav of the pn junction 19 is lower than the avalanche voltage of the pn junction of the p-gate region 2 and the n-drift region 4, and thus the ESD breakdown occurs at the pn junction 19.

Embodiment 2

Figure 6A:
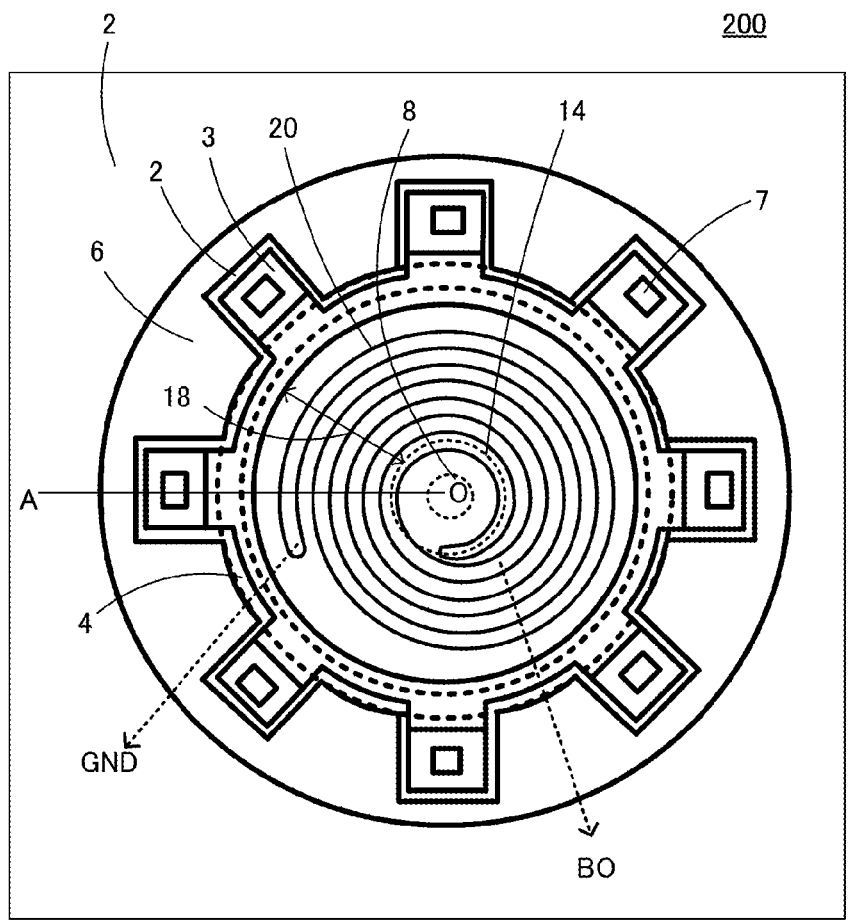
FIGS. 6A and 6B are views of a configuration of a high voltage JFET 100 of Embodiment 2 according to one aspect of the present invention.
Figure 6B:
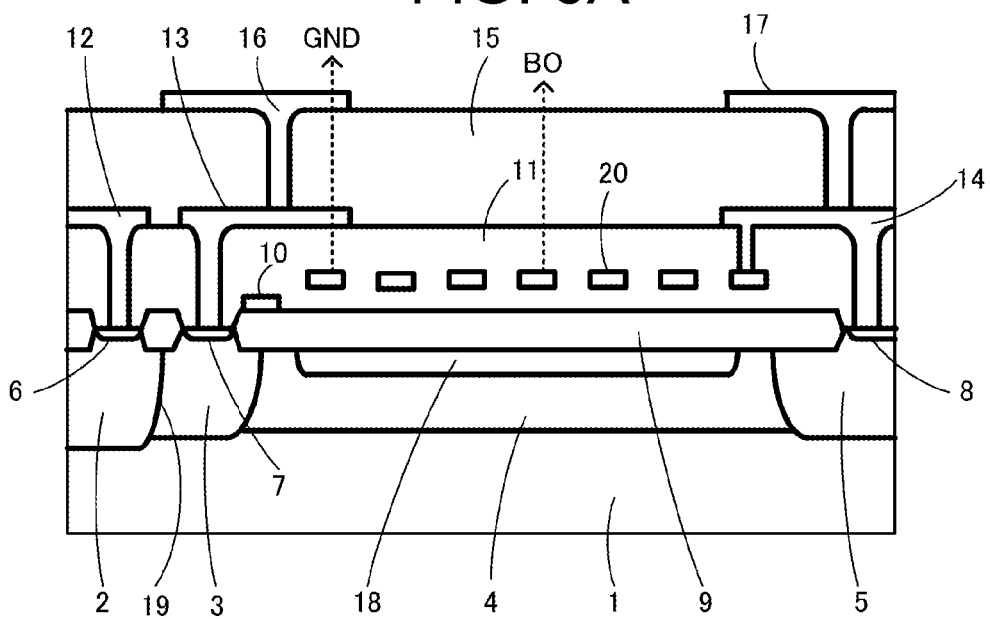

FIGS. 6A and 6B are a configuration of a high voltage JFET 200 according to Embodiment 2 of the present invention. FIG. 6A is a plan view of main parts of the JFET 200, and FIG. 6B is a cross-sectional view of the main parts in FIG. 6A cut along the line A-O.

FIGS. 6A and 6B differ from FIG. 1 and FIGS. 2A and 2B in that a coil-shaped resistor 20 made of polysilicon is formed in a first interlayer insulating film 11. The coil-shaped resistor 20 is an input voltage detection resistor connected between a drain electrode 14 and ground, and forms a part of the resistor circuit 42 in FIG. 3. This resistor 20 also equalizes the expansion of the depletion region spreading to an n-drift region 4. By providing the resistor 20, it is possible to further improve ESD capacity.

Embodiment 3

Figure 7A:
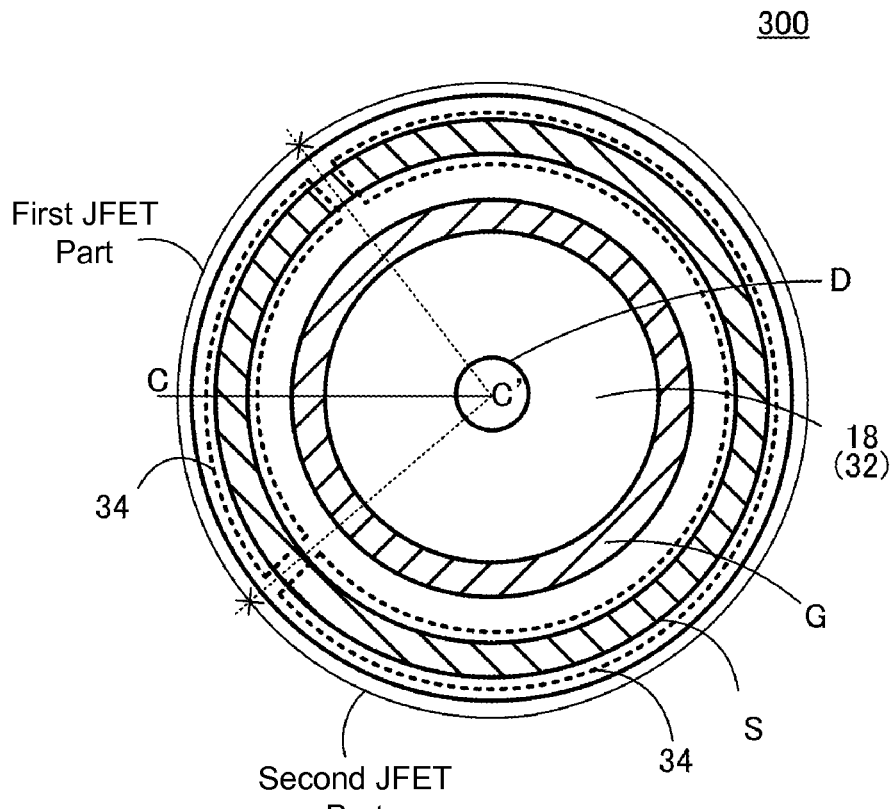
FIGS. 7A and 7B are views of a configuration of a junction field effect transistor 300 of Embodiment 3 according to one aspect of the present invention.
Figure 7B:
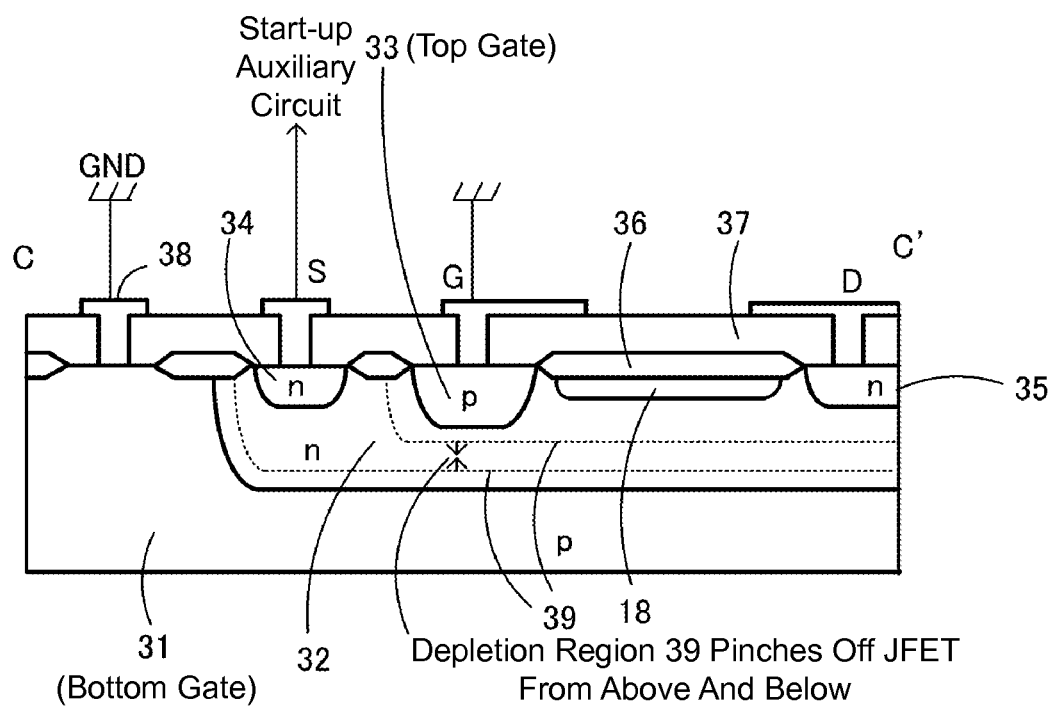

FIGS. 7A and 7B are a configuration of a high voltage JFET 300 according to Embodiment 3 of the present invention. FIG. 7A is a cross-sectional view of main parts of the JFET 300, and FIG. 7B is a cross-sectional view of the main parts in FIG. 7A cut along the line C-C'.

FIGS. 7A and 7B differ from FIG. 1 and FIGS. 2A and 2B by showing a vertical high voltage JFET in which depletion regions 39 contact each other and pinch off the JFET by vertically extending in an n-drift region 32 from a p+ substrate 31 side, which is the gate, and a p-diffusion region 33. This configuration also makes it possible to improve ESD capacity by providing a p-floating region 18. The polysilicon coil-shaped resistor 20 shown in FIG. 6A can further improve ESD capacity by being formed in an interlayer insulating film 37.

In the drawings, the reference character 34 is an n-source region, 35 is an n-drain region, 36 is a LOCOS oxide film, 38 is a ground electrode, S is a source electrode, G is a gate electrode, and D is a drain electrode.

Figure 8:
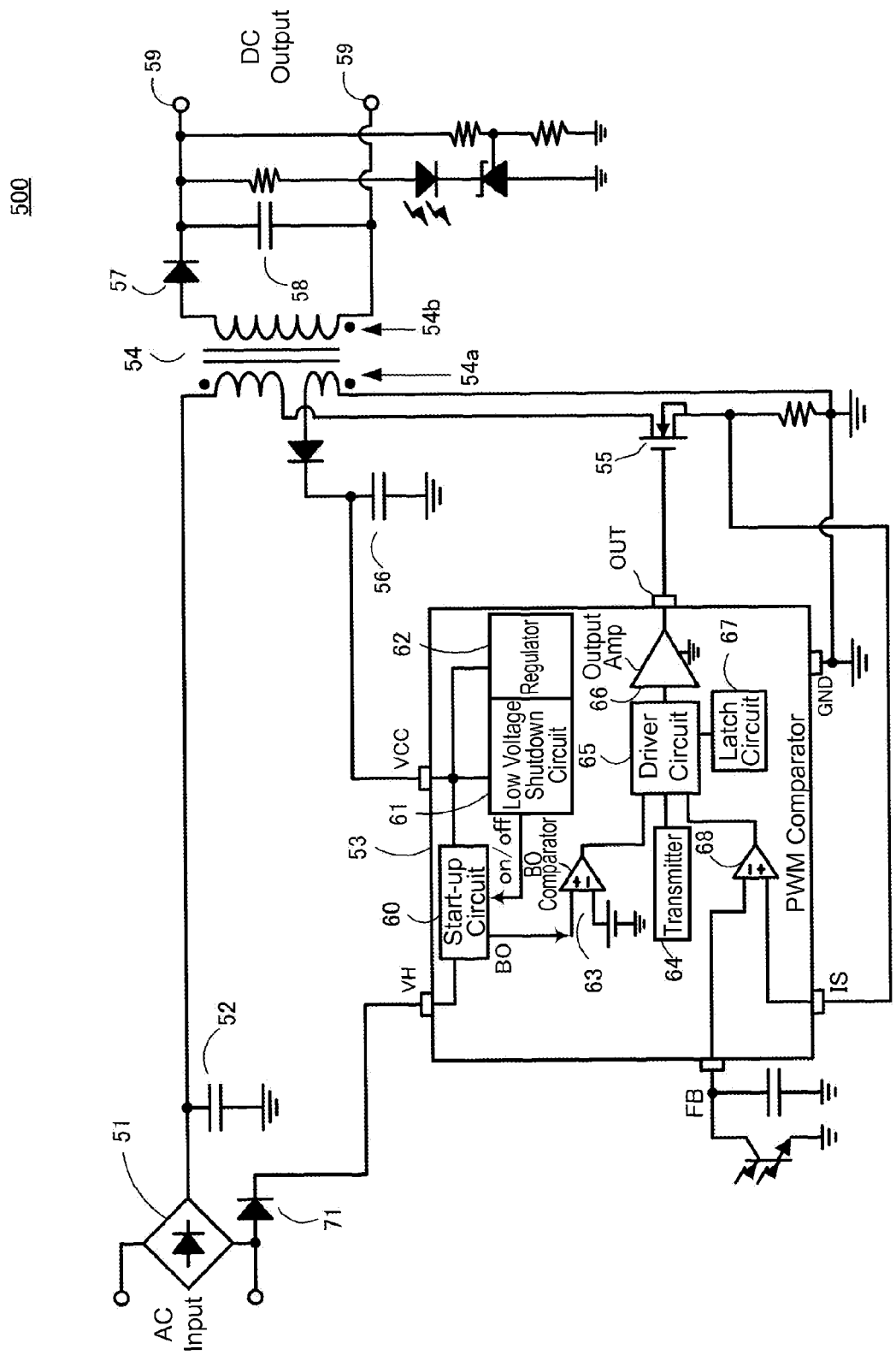
FIG. 8 is a circuit diagram of a switching power supply device 500.

The high voltage JFETs 100 to 300 in Embodiments 1 to 3 show a switching power supply control IC or the like in which a control circuit equivalent to FIG. 8 having a single high voltage JFET, or a start-up circuit 40 including the high voltage JFET is formed on the same semiconductor substrate.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A junction field effect transistor, comprising:
a second conductivity type drain region formed in a surface of a first conductivity type semiconductor region;
a second conductivity type drift region contacting said drain region and formed in the surface of the semiconductor region;
a second conductivity type source region contacting said drift region and formed in the surface of the semiconductor region separated from the drain region;
an interlayer insulating film formed on the semiconductor region; and
a first conductivity type floating region formed in a surface of the drift region separated from the source region, said floating region being electrically floating.

2. The junction field effect transistor according to claim 1, wherein the drift region and the source region are formed surrounding the drain region.

3. The junction field effect transistor according to claim 2, wherein the source region is made of a plurality of regions, and
wherein the semiconductor region or a first conductivity type gate region having a higher impurity concentration than the semiconductor region is provided between said plurality of regions forming said source region.

4. The junction field effect transistor according to claim 2, further comprising a resistor element disposed inside the interlayer insulating film.

5. The junction field effect transistor according to claim 4, wherein the resistor element is made of polysilicon and has a coil-like shape in a plan view.

6. The junction field effect transistor according to claim 4, wherein the resistor element electrically connects to the drain region.

7. A junction field effect transistor, comprising:
a second conductivity type drift region disposed in a surface of a first conductivity type semiconductor substrate;
a second conductivity type drain region contacting the drift region;
a second conductivity type source region that contacts a side of the drift region opposite to the drain region;
a first conductivity type gate region contacting the source region and the drift region;
a second conductivity type drain contact region that is disposed on a surface of the drain region and that has a higher impurity concentration than the drain region;
a second conductivity type source contact region that is disposed on a surface of the source region and that has a higher impurity concentration than the source region;
a first conductivity type gate contact region that is disposed on a surface of the gate region and that has a higher impurity concentration than the gate region;
an insulating film disposed on the drift region, the drain region, and the source region, said insulating film exposing the drain contact region, the source contact region, and the gate contact region;
a polysilicon gate electrode disposed on the insulating film;
a first interlayer insulating film covering the insulating film and the polysilicon gate electrode;
a drain electrode disposed on the first interlayer insulating film and connecting with the drain contact region;
a source electrode disposed on the first interlayer insulating film and connecting with the source contact region;
a gate electrode wiring line disposed on the first interlayer insulating film and connecting with the gate contact region and the polysilicon gate electrode;
a second interlayer insulating film covering the first interlayer insulating film, the first drain electrode, the first source electrode, and the gate electrode wiring line;
a drain electrode wiring line disposed on the second interlayer insulating film and connecting with the drain electrode;
a source electrode wiring line disposed on the second interlayer insulating film and connected with the source electrode; and
a first conductivity type floating region formed in a surface of the drift region, said floating region being electrically floating.

8. The junction field effect transistor according to claim 7, wherein the floating region is formed separated from the source region and the drain region.

9. The junction field effect transistor according to claim 7, further comprising a resistor element made of polysilicon disposed inside the first interlayer insulating film, said resistor element having an end thereof electrically connected to the drain electrode.

10. The junction field effect transistor according to claim 7,
wherein the drain contact region has a circular shape in a plan view,
wherein the drain region is provided so as to be in a concentric circle with the drain contact region in a plan view,
wherein the floating region is provided in a ring shape surrounding the drain region, and
wherein the gate region surrounds the drift region and contacts the drift region.

11. The junction field effect transistor according to claim 3, further comprising a resistor element disposed inside the interlayer insulating film.

12. The junction field effect transistor according to claim 5, wherein the resistor element electrically connects to the drain region.

13. The junction field effect transistor according to claim 8,
wherein the drain contact region has a circular shape in a plan view,
wherein the drain region is provided so as to be in a concentric circle with the drain contact region in a plan view,
wherein the floating region is provided in a ring shape surrounding the drain region, and
wherein the gate region surrounds the drift region and contacts the drift region.

14. The junction field effect transistor according to claim 9,
wherein the drain contact region has a circular shape in a plan view,
wherein the drain region is provided so as to be in a concentric circle with the drain contact region in a plan view,
wherein the floating region is provided in a ring shape surrounding the drain region, and
wherein the gate region surrounds the drift region and contacts the drift region.

* * * * *